United States Patent
Patel et al.

(10) Patent No.: US 11,677,337 B2
(45) Date of Patent: Jun. 13, 2023

(54) COMB DRIVE FOR MICROELECTROMECHANICAL SYSTEM

(71) Applicant: AAC ACOUSTIC TECHNOLOGIES (SHENZHEN) CO., LTD., Shenzhen (CN)

(72) Inventors: Anup Patel, Eb (GB); Yannick Pierre Kervran, Hk (FR); Euan James Boyd, Eb (GB)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 8 days.

(21) Appl. No.: 17/401,350

(22) Filed: Aug. 13, 2021

(65) Prior Publication Data

US 2023/0047220 A1 Feb. 16, 2023

(51) Int. Cl.
*H02N 1/00* (2006.01)
*B81B 3/00* (2006.01)

(52) U.S. Cl.
CPC .......... *H02N 1/008* (2013.01); *B81B 3/0021* (2013.01); *B81B 2201/033* (2013.01); *B81B 2203/0136* (2013.01)

(58) Field of Classification Search
CPC ................ H02N 1/008; B81B 3/0021; B81B 2201/033; B81B 2203/0136
See application file for complete search history.

(56) References Cited

U.S. PATENT DOCUMENTS

| | | | |
|---|---|---|---|
| 6,204,544 B1* | 3/2001 | Wang | G01P 15/124 257/253 |
| 2007/0029629 A1* | 2/2007 | Yazdi | G01C 19/5719 73/514.32 |
| 2010/0043551 A1* | 2/2010 | Geen | G01P 15/125 73/514.32 |

* cited by examiner

*Primary Examiner* — Bernard Rojas
(74) *Attorney, Agent, or Firm* — W&G Law Group

(57) ABSTRACT

A comb drive for MEMS device includes a stator and a rotor displaceable relative to the stator in a first direction. The stator includes stator comb fingers and the rotor includes rotor comb fingers. The stator comb fingers are coupled to two high impedance nodes to form high impedance node domains arranged in the first direction. The rotor comb fingers are coupled to two oppositely biased electrodes to form oppositely biased domains. Pairs of capacitors with opposite acoustic polarity are respectively formed between the high impedance node domains and the oppositely biased domains. The comb drive of the present invention has increased electrostatic sensitivity for a given unit cell cross-sectional area whilst maintaining an acceptable capacitance and linearity of voltage signal vs displacement. Extra force shim unit cells may be used, which allows for the stiffness between the rotor and stator to be controlled and reduced to zero for a particular displacement range, without impacting sensitivity.

15 Claims, 4 Drawing Sheets

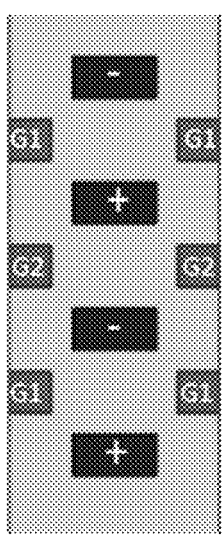 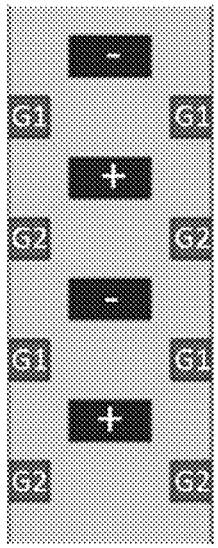 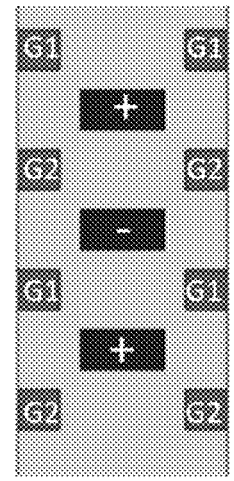
FIG. 4a  FIG. 4b  FIG. 4c
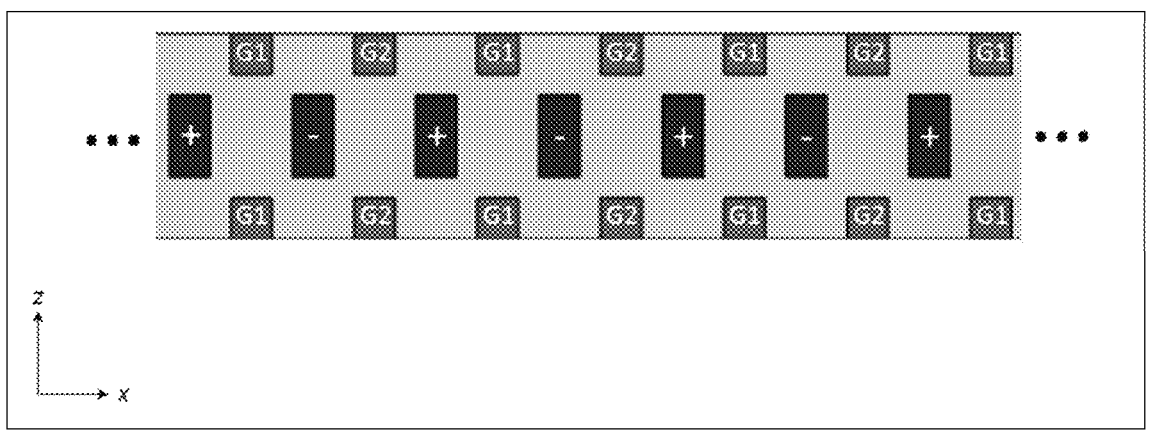
FIG. 5

COMB DRIVE FOR MICROELECTROMECHANICAL SYSTEM

FIELD OF THE INVENTION

The present disclosure relates to the field of microelectromechanical system (MEMS), and in particular, to an electrostatic comb drive for a microelectromechanical system device.

BACKGROUND

Electrostatic comb drives have been used in a number of MEMS devices to sense displacement of membranes of the MEMS devices based on a capacitance change. Compared with other kinds of capacitance geometries such as capacitors consisted of parallel plates, the electrostatic comb drives have advantages such as a low acoustic resistance when driven by a membrane in close proximity, the gap between rotor and stator not changing with actuation which prevents electrostatic pull-in, and high linearity of voltage verses displacement when driven in constant charge mode.

A typical comb drive comprises a repeating unit cell which has a single conducting rotor comb finger and a single conducting stator comb finger. One of the rotor comb finger and the stator comb finger is coupled to a high impedance node (HIN) and the other of the rotor comb finger and the stator comb finger is coupled to a constant voltage bias. The comb fingers are interdigitated to form a capacitor therebetween and movement of the rotor causes a change in capacitance of the capacitor which is measured as voltage using a conventional MEMS-ASIC constant charge mode circuit.

Further developments include using multiple conducting domains to form two capacitors leading to a potential divider circuit, which allows a greater range of displacement of the rotor over which the electrostatic sensitivity is constant and a high linearity of voltage signal versus displacement.

However, for the above-mentioned comb drives, it is difficult to achieve very high electrostatic sensitivity without severely compromising other factors, difficult to control the stiffness between the stator and the rotor resulting from electrostatic forces and difficult to set the stiffness to zero for the operating position with the highest sensitivity.

Therefore, it is desired to provide an improved comb drive for microelectromechanical system which can overcome at least one of the above problems.

SUMMARY

In one aspect, the present disclosure provides a comb drive for microelectromechanical system (MEMS) device. The comb drive comprises a stator comprising conducting stator comb fingers and a rotor comprising conducting rotor comb fingers displaceable relative to the stator comb fingers in a first direction. Each stator comb finger is coupled to one high impedance node (HIN) of at least two sets of independent HINs such that at least two HIN domains are arranged in the first direction. Each rotor comb finger is coupled to one of two biased nodes typically of opposite polarity, thereby forming at least two oppositely biased domains. Alternatively, the rotor comb fingers can be coupled to the HINs and the stator comb fingers can be coupled to the biased nodes. Pairs of capacitors with opposite acoustic polarity in each pair are respectively formed between the at least two HIN domains and the at least two oppositely biased domains.

In some embodiments, the at least two HIN domains and the two oppositely biased domains are arranged without overlapping in the first direction at a rest position where no voltage is applied to the comb drive.

In some embodiments, the stator comb fingers extend along a second direction which is perpendicular to the first direction.

In some embodiments, the biased domains each comprises a rectangular cross section perpendicular to the second direction, the rectangular cross section comprises a height dimension parallel to the first direction and a width dimension perpendicular to the first direction and the second direction, and the height dimension is less than the width dimension.

In some embodiments, the comb drive comprises a plurality of material layers stacked in the first direction.

In some embodiments, the comb drive comprises a plurality of material layers stacked in a third direction which is perpendicular to the first direction and the second direction.

In some embodiments, the number of the HIN domains is less than that of the biased domains, and the comb drive further comprises additional biased electrodes mounted to the stator.

In some embodiments, the comb drive further comprises an additional cell that has the sole purpose of providing a positive or negative stiffness contribution to the comb drive using biased rotor electrodes of alternating polarity and grounded stator electrodes.

In some embodiments, the comb drive further comprises an additional cell that has the sole purpose of providing a positive or negative stiffness contribution to the comb drive using biased rotor electrodes of same polarity and grounded stator electrodes.

In some embodiments, the comb drive further comprises an additional cell that has the sole purpose of providing a positive or negative stiffness contribution to the comb drive using biased rotor electrodes of alternating polarity and biased stator electrodes of alternating polarity.

In some embodiments, the biased electrode and the another biased electrode have equal voltage magnitude.

In some embodiments, the biased electrode and the another biased electrode have different voltage magnitude.

In another aspect, the present invention provides a divider circuit of a comb drive. The circuit comprises a first HIN and a second HIN where a voltage signal is output differentially therebetween; a first pair of capacitors with opposite acoustic polarity formed between the first HIN and two oppositely biased electrodes respectively; and a second pair of capacitors with opposite acoustic polarity formed between the second HIN and the two oppositely biased electrodes respectively.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

FIGS. 4a-4c illustrate electrostatic comb drives similar to the electrostatic comb drive of FIG. 1, but with larger arrays of domains.

FIG. 5 illustrates an electrostatic comb drive for microelectromechanical system (MEMS) device in accordance with an alternative embodiment of the present invention.

DESCRIPTION OF THE EMBODIMENTS

Figure 1:
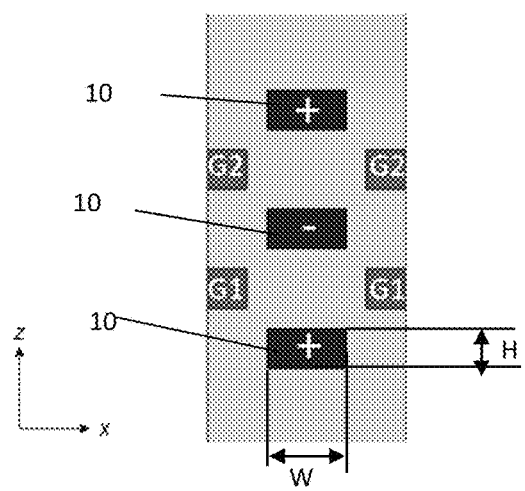
FIG. 1 illustrates an electrostatic comb drive for microelectromechanical system (MEMS) device in accordance with an embodiment of the present invention.

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the Application. In addition, an illustrated embodiment need not have all the aspects or advantages shown.

An electrostatic comb drive for microelectromechanical system (MEMS) device in accordance with the present invention comprises a stator comprising a set of conducting stator comb fingers; and a rotor comprising a set of conducting rotor comb fingers displaceable relative to the stator comb fingers in a first direction. Within a unit cell, one of the stator comb fingers is coupled to a high impedance node (HIN) and another stator comb finger is coupled to a separate, independent HIN to form at least two HIN domains alternatingly arranged in the first direction; and one of the rotor comb fingers is coupled to a first biased electrode of given voltage and another rotor comb finger is coupled to a second biased electrode which is of equal voltage magnitude but opposite polarity to the first biased electrode, to thereby form at least two oppositely biased domains alternatingly arranged in the first direction. Alternatively, the rotor comb fingers can be coupled to the HINs and the stator comb fingers can be coupled to the biased electrodes. The first biased electrode and the second biased electrode may have different voltage magnitude. Pairs of capacitors with opposite acoustic polarity are respectively formed between the at least two HIN domains and the at least two oppositely biased domains. In the present invention, for the same sound pressure input on the MEMS device, the acoustic polarity of the capacitor can be positive if the capacitance of the capacitor increases (e.g. the adjacent area between the comb fingers of the capacitor increases) or negative if the capacitance of the capacitor decreases (e.g. the adjacent area between the comb fingers of the capacitor decreases). A biased domain and a HIN domain adjacent to the biased domain form a sense unit cell of the comb drive. The comb drive may comprise a plurality of sense unit cells extending in the first direction or another direction.

Figure 2:
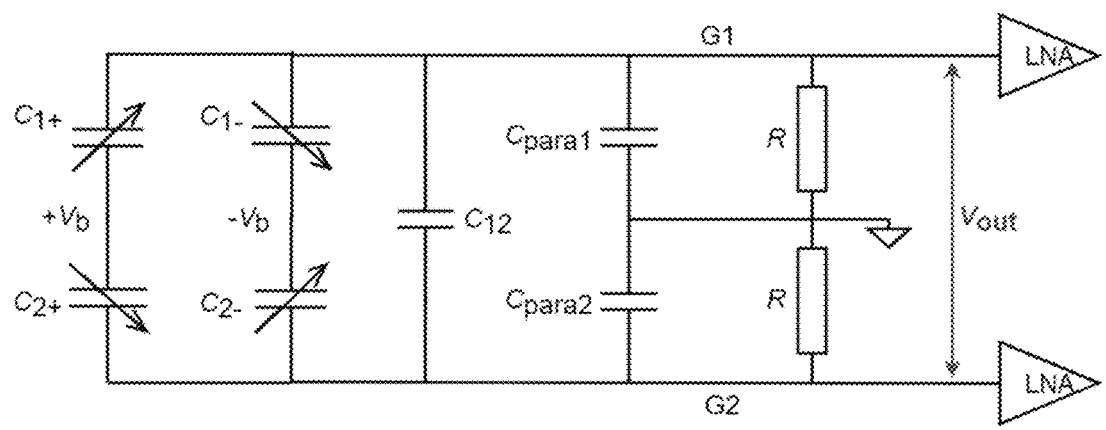
FIG. 2 illustrates the circuit of the electrostatic comb drive of FIG. 1.

FIG. 1 illustrates an electrostatic comb drive for microelectromechanical system (MEMS) device in accordance with an embodiment of the present invention. FIG. 2 illustrates the circuit of the electrostatic comb drive of FIG. 1.

Referring to FIG. 1 and FIG. 2, the electrostatic comb drive comprises two HIN domains G1, G2 arranged in the direction of Z-axis, three biased domains 10 coupled to two oppositely biased electrodes +Vb, -Vb and two pairs of capacitors C1+, C1-, C2+, C2- with opposite acoustic polarity within each pair. The capacitors C1+, C1- are respectively formed between the electrode +Vb, -Vb and the HIN domain G1. The capacitors C2+, C2- are respectively formed by the electrode +Vb, -Vb and the HIN domain G2.

Figure 3:
FIG. 3 illustrates a projection of the electrostatic comb drive of FIG. 1 in Y-Z plane.

Referring to FIG. 3, in some embodiments, each of the biased domains 10 comprises at least one finger 12 extending along a second direction which is perpendicular to the first direction. Each of the HIN domains G1/G2 comprises at least one finger 22 extending along the second direction. In the embodiments, the membrane of the MEMS device is displaceable along the direction of Z-axis when a voltage signal is applied to the drive. The first direction is the direction of Z-axis and the second direction is the direction of Y-axis.

In some embodiments, the at least two HIN domains G1/G2 and the two oppositely biased domains 10 are arranged without overlapping in the first direction at a rest position where no voltage signal is applied to the drive. That is, the biased domains 10 are relatively short in the displacement axis, which allows a repeating structure in the displacement axis to thereby increase the electrostatic sensitivity of the drive. The use of two biased electrodes and two HINs in combination with short electrode geometries allows for high electrostatic sensitivity.

In some embodiments, the biased domain 10 comprises a rectangular cross section perpendicular to the second direction. The rectangular cross section comprises a height dimension H parallel to the first direction and a width dimension W in the third direction which is perpendicular to the first direction and the second direction. Preferably, H is less than W to thereby achieve a relatively short electrode.

In some embodiments, the comb drive comprises a plurality of layers such as a substrate layer, a conductive layer and an insulating layer, stacked in the first direction, i.e., the direction of Z-axis.

In order to take most advantage of the ability of the structure to be arrayed in the Z-axis or the axis of rotor/membrane displacement, larger arrays with more domains are preferable as illustrated in the embodiments in FIG. 4a, FIG. 4b and FIG. 4c. In the embodiment as shown in FIG. 4a, the comb drive comprises three HIN domains and four biased domains. In the embodiment as shown in FIG. 4b, the comb drive comprises four HIN domains and four biased domains. In the embodiment as shown in FIG. 4c, the comb drive comprises four HIN domains and three biased domains. Preferably, the comb drive comprises at least two HIN domains and two oppositely biased domains with the ends of the array being terminated in different ways as shown by embodiments of FIG. 4a, FIG. 4b and FIG. 4c.

FIG. 5 illustrates an electrostatic comb drive for microelectromechanical system (MEMS) device in accordance with an alternative embodiment of the present invention. In this embodiment, the first direction is the direction of X-axis. The comb drive comprises two HINs and two biased electrodes +Vb, −Vb. The two HINs are coupled to the stator comb fingers or rotor comb fingers 12/22 to form a plurality of HIN domains G1, G2 alternatingly arranged in the direction of X-axis. The two biased electrodes +Vb, −Vb are coupled to the rotor comb fingers or stator comb fingers 22/12 to form a plurality of biased domains alternatingly arranged in the direction of X-axis. Comb fingers 12/22 extend in the direction of Y-axis as shown in FIG. 3. The capacitors C1+, C1− are respectively formed by the HIN domains G1 and adjacent biased domains coupled to the electrode +Vb, −Vb. The capacitors C2+, C2− are respectively formed by the HIN domains G2 and adjacent biased domains coupled to the electrode +Vb, −Vb. The rotor/membrane of the MEMS device is displaceable in the direction of X-axis when a voltage signal is applied to the drive. The comb drive comprises a plurality of material layers deposited in the X-Y plane. That is, the material layers are stacked in the direction of Z-axis which is perpendicular to the X-Y plane. In this embodiment, the plurality of unit cells of the comb drive is arranged in the direction of X-axis. That is, the extending direction of the unit cells of the comb drive is different from the direction of material layers being stacked, which removes the constraint on the array length of the unit cells in the direction of rotor movement and allows for a high capacitance between each biased electrode and a corresponding HIN.

Figure 6:
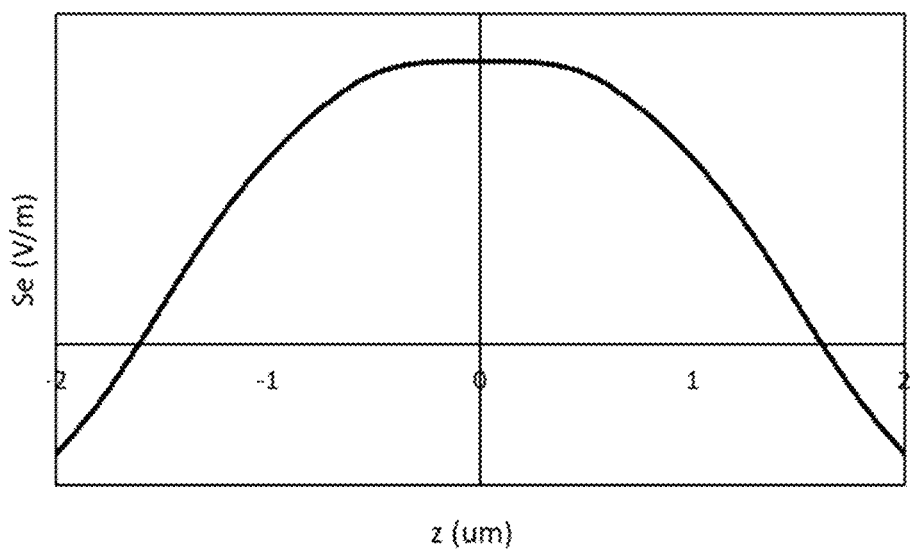
FIG. 6 illustrates a diagram of the electrostatic sensitivity versus displacement of the rotor for one of the embodiments of FIGS. 4a-4c.
Figure 7:
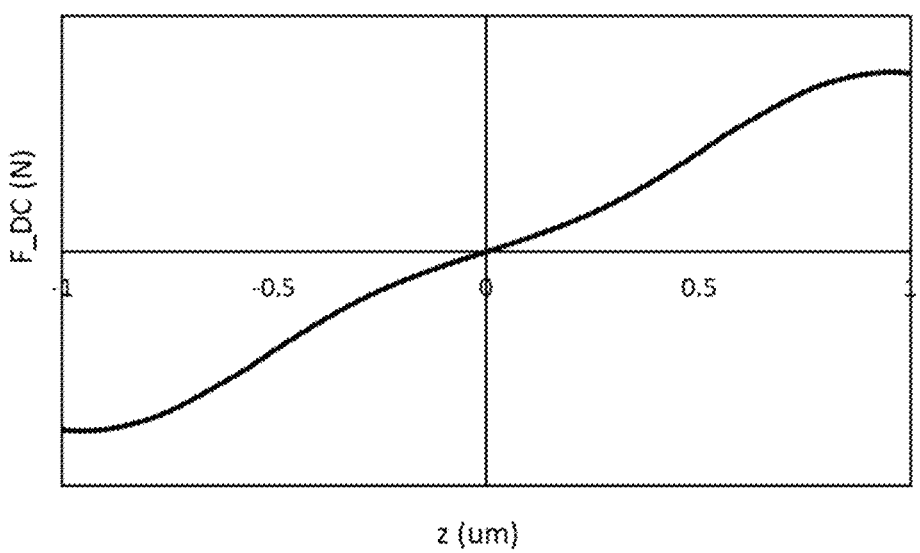
FIG. 7 illustrates a diagram of force versus DC displacement of the rotor for one of the embodiments of FIGS. 4a-4c.

One of the issues that may arise when using a high sensitivity comb drive in a MEMS device is the force and stiffness between the rotor and stator resulting from electrostatic fields. For the embodiments described above, the rotor domains are in a Z-axis rest position of maximum electrostatic sensitivity. A typical electrostatic sensitivity versus rest position for one of the embodiments of FIGS. 4a-4c is shown as FIG. 6, with a z=0 position corresponding to the position of the rotor of the one of the embodiments of FIGS. 4a-4c. The HIN acts as an RC filter with a given cut off frequency when the high impedance node is coupled to a capacitor of the MEMS. For slow rotor movements and hence slow capacitance changes below the cutoff frequency, the HIN acts to provide a constant voltage; this behavior can be described as DC displacement. For fast rotor movements and hence fast capacitance changes above the cutoff frequency, the HIN acts to preserve a constant charge; this behavior can be described as AC displacement. The force verses DC displacement in the z-axis is shown as FIG. 7 such that the circuit is in voltage rather than charge mode, hence the use of DC to denote the force type.

Figure 8:
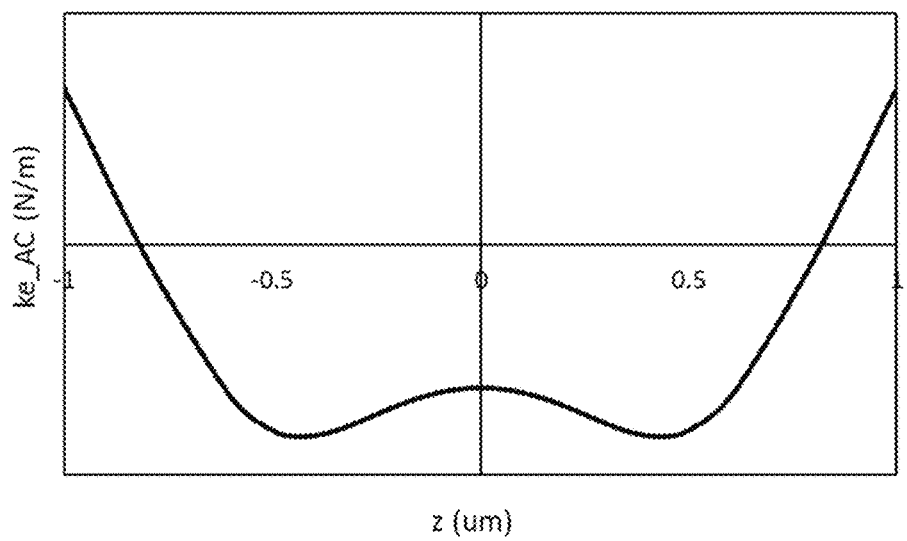
FIG. 8 illustrates a diagram of electrostatic stiffness for an AC displacement perturbation versus DC rest position of the rotor from a maximum sensitivity position at z=0.

The electrostatic stiffness, ke_AC, under AC actuation and hence charge mode operation of the circuit, is shown in FIG. 8. It can be seen that the stiffness of the MEMS comb drive for both DC and AC displacement from the rest position, is negative and corresponds to an unstable equilibrium. An unstable electrostatic equilibrium may be stabilized by a mechanical component having positive stiffness such as a membrane or cantilever. However, for some designs it is desirable to not place any extra design constraints on what the stiffness of a supporting mechanical structure needs to be. In this case it is desirable for the comb drive to have zero electrostatic stiffness under DC and AC displacements from a maximum sensitivity rest position.

Figure 9:
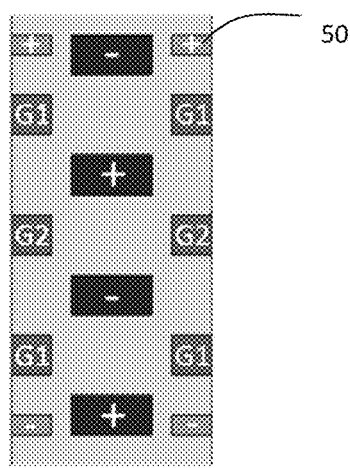
FIG. 9 illustrates an alternative embodiment similar to the embodiment of FIG. 7a, where additional biased electrodes have been added to the stator.

In order to achieve zero stiffness, extra electrostatic domains may be used to cancel out the forces when one of the previous embodiments undergoes rotor displacement. FIG. 9 illustrates an alternative embodiment similar to the embodiment of FIG. 7a, where additional biased electrodes 50 have been added to the stator. The additional biased electrodes 50 interact with the biased rotor domains that are close to the additional biased electrodes 50, achieving a positive stiffness for a displacement of the rotor. By varying the geometry or bias of these extra force shim domains, the total stiffness of the unit cell can be controlled and made to be zero.

Figures 10A, 10B, 10C:
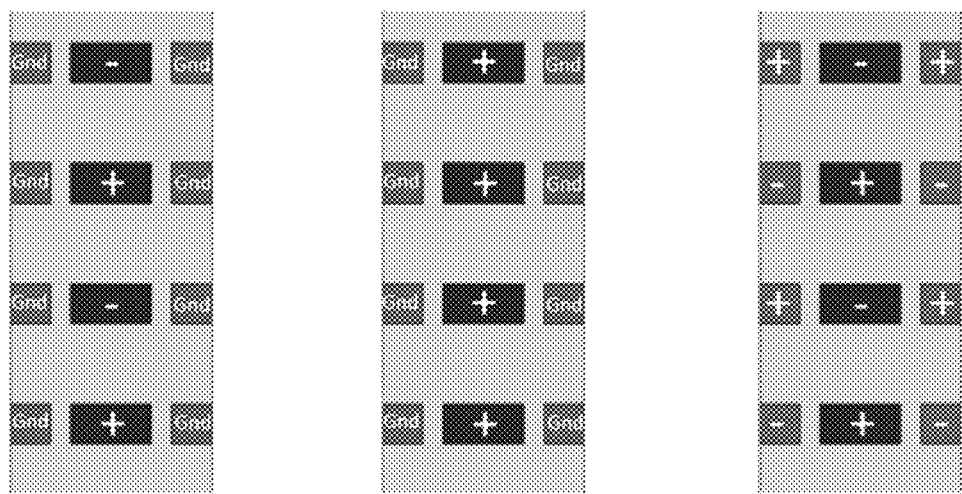
FIG. 10a illustrates an embodiment where the comb drive comprises an additional cell that has the sole purpose of providing a positive stiffness contribution to the comb drive using biased rotor electrodes of alternating polarity and grounded stator electrodes.
FIG. 10b illustrates an embodiment where the comb drive comprises an additional cell that has the sole purpose of providing a positive stiffness contribution to the comb drive using biased rotor electrodes of the same polarity and grounded stator electrodes.
FIG. 10c illustrates an embodiment where the comb drive comprises an additional cell that has the sole purpose of providing a positive stiffness contribution to the comb drive using biased rotor and stator electrodes of alternative polarity.

Alternatively, the unit cells (also named as sense cells) such as those in FIGS. 7b and 7c can be left unchanged and additional separate shim cells can be added in the y-axis array of the combs, one for every N sense cells where N>1. FIG. 10a illustrates an embodiment where the comb drive comprises an additional cell that has the major or sole purpose of providing a positive stiffness contribution to the comb drive using biased rotor electrodes of alternating polarity and grounded stator electrodes. FIG. 10b illustrates an embodiment where the comb drive comprises an additional cell that has the major or sole purpose of providing a positive stiffness contribution to the comb drive using biased rotor electrodes of the same polarity and grounded stator electrodes. FIG. 10c illustrates an embodiment where the comb drive comprises an additional cell that has the sole purpose of providing a positive stiffness contribution to the comb drive using biased rotor and stator electrodes of alternative polarity. Referring to FIG. 10a, FIG. 10b and FIG. 10c, in these embodiments extra force shim cells have the same rotor geometry as the sense cells. However, the stator electrodes are different from that of the sense cells. In these embodiments, the stator electrodes are aligned with the rotor electrodes and the stator electrodes have the same height as their neighboring rotor electrodes. These extra force shim cells have positive stiffness for displacement from the rest positions. Alternatively, the stator electrodes may have different height from their neighboring rotor electrodes and the stator electrodes may be offset from their neighboring rotor electrodes. In the embodiments as shown in FIG. 10a, FIG. 10b and FIG. 10c, the positive and negative bias of the shim force cells shown in FIG. 10a, FIG. 10b and FIG. 10c can be the same as that used in the sense cells and the electrical ground, if needed is common ground. Therefore, the shim cells do not require additional pad connections in the MEMS die.

The comb drive according to the above embodiment of the present disclosure allows for approximately 2-3 times higher electrostatic sensitivity for a given unit cell cross-sectional area whilst maintaining an acceptable capacitance and linearity of voltage signal vs displacement for an AC displacement. The addition of extra force shim unit cells to an array of the main sense cells, also allows for the stiffness between the rotor and stator, resulting from electrostatic interaction, to be controlled and reduced to zero for a particular displacement operating range, without impacting sensitivity.

It may be desirable in some designs for the comb drive to have negative stiffness so that when the comb drive is mechanically coupled to a membrane or cantilever with high positive stiffness, the net effective stiffness of the system is reduced in magnitude but still positive, which can be used to increase the effective compliance of an atmosphere facing membrane, therefore increasing its mechanical sensitivity. Embodiments that allow the stiffness of the comb drive to be more negative include an embodiment similar to the one shown in FIG. 9 but with the polarity of the additional biased stator electrodes being switched and another embodiment similar to the one shown in FIG. 10c but with the polarity of either the biased stator or rotor electrodes being switched. In the embodiments as shown in FIGS. 10a and 10b, if the rotors of both these designs are moved so that the rotor and stator electrodes are misaligned at the new rest positions, then these configurations would provide negative stiffness.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated above should not be interpreted as limits to the present invention, and the scope of the invention is to be determined by reference to the claims that follow.

What is claimed is:

1. A comb drive for microelectromechanical system (MEMS) device comprising a first set of comb fingers and a second set of comb fingers displaceable relative to each other,
   wherein one of the first set of comb fingers is coupled to a high impedance node (HIN) and another of the first set of comb fingers is coupled to another separate and independent HIN to form at least two HIN domains alternatingly arranged in a first direction;
   one of the second set of comb fingers is coupled to a biased electrode and another of the second set of comb fingers is coupled to another biased electrode with opposite polarity to the biased electrode, to form at least two oppositely biased domains alternatingly arranged in the first direction; and
   pairs of capacitors with opposite acoustic polarity within each pair are respectively formed between the at least two HIN domains and the at least two oppositely biased domains.

2. The comb drive of claim 1, wherein the at least two HIN domains and the two oppositely biased domains are arranged without overlapping in the first direction at a rest position where no voltage is applied to the comb drive.

3. The comb drive of claim 1, wherein the first set comb fingers extend along a second direction which is perpendicular to the first direction.

4. The comb drive of claim 3, wherein the biased domains each comprises a rectangular cross section perpendicular to the second direction, the rectangular cross section comprises a height dimension parallel to the first direction and a width dimension perpendicular to the first direction and the second direction, and the height dimension is less than the width dimension.

5. The comb drive of claim 1, wherein the number of the HIN domains is less than that of the biased domains, and the comb drive further comprises additional biased electrodes mounted to the stator.

6. The comb drive of claim 1, wherein the comb drive further comprises an additional cell that has a purpose of providing a positive stiffness contribution to the comb drive using biased rotor electrodes of alternating polarity and grounded stator electrodes.

7. The comb drive of claim 1, wherein the comb drive further comprises an additional cell that has a purpose of providing a positive stiffness contribution to the comb drive using biased rotor electrodes of same polarity and grounded stator electrodes.

8. The comb drive of claim 1, wherein the comb drive further comprises an additional cell that has a purpose of providing a positive stiffness contribution to the comb drive using biased rotor electrodes of alternating polarity and biased stator electrodes of alternating polarity.

9. The comb drive of claim 1, wherein the comb drive further comprises an additional cell that has a purpose of providing a negative stiffness contribution to the comb drive using biased rotor electrodes of alternating polarity and grounded stator electrodes.

10. The comb drive of claim 1, wherein the comb drive further comprises an additional cell that has a purpose of providing a negative stiffness contribution to the comb drive using biased rotor electrodes of same polarity and grounded stator electrodes.

11. The comb drive of claim 1, wherein the comb drive further comprises an additional cell that has the sole purpose of providing a negative stiffness contribution to the comb drive using biased rotor electrodes of alternating polarity and biased stator electrodes of alternating polarity.

12. The comb drive of claim 1, wherein the biased electrode and the another biased electrode have equal voltage magnitude.

13. The comb drive of claim 1, wherein the biased electrode and the another biased electrode have different voltage magnitude.

14. The comb drive of claim 1, wherein the first set of comb fingers are stator comb fingers and the second set of comb fingers are rotor comb finger; or
   the first set of comb fingers are rotor comb fingers and the second set of comb fingers are stator comb finger.

15. A divider circuit of a comb drive comprising:
   a first HIN and a second HIN where a voltage signal is output differentially therebetween;
   a first pair of capacitors with opposite acoustic polarity formed between the first HIN and two oppositely biased electrodes respectively; and
   a second pair of capacitors with opposite acoustic polarity formed between the second HIN and the two oppositely biased electrodes respectively.

* * * * *